United States Patent [19]

Baldi

[11] Patent Number: 4,615,920
[45] Date of Patent: Oct. 7, 1986

[54] PYROPHORIC STAINLESS STEEL

[75] Inventor: Alfonso L. Baldi, Wynnewood, Pa.

[73] Assignee: Alloy Surfaces Company, Inc., Wilmington, Del.

[21] Appl. No.: 488,103

[22] Filed: Apr. 25, 1983

Related U.S. Application Data

[63] Continuation-in-part of Ser. No. 479,211, Mar. 28, 1983, and a continuation-in-part of Ser. No. 417,214, Sep. 13, 1982, abandoned, and a continuation-in-part of Ser. No. 311,621, Oct. 14, 1981, abandoned, and a continuation-in-part of Ser. No. 302,979, Sep. 17, 1981, abandoned, and a continuation-in-part of Ser. No. 191,780, Sep. 29, 1980, abandoned, and a continuation-in-part of Ser. No. 172,671, Jul. 28, 1980, Pat. No. 4,435,481, and a continuation-in-part of Ser. No. 851,504, Nov. 14, 1977, said Ser. No. 479,211, said Ser. No. 417,214, said Ser. No. 311,621, said Ser. No. 302,979, is a continuation-in-part of Ser. No. 238,500, Feb. 26, 1981, Pat. No. 4,350,719, and Ser. No. 230,333, Feb. 8, 1981, Pat. No. 4,347,267, said Ser. No. 479,211, said Ser. No. 417,214, said Ser. No. 311,621, said Ser. No. 302,979, said Ser. No. 191,780, said Ser. No. 172,671, is a continuation-in-part of Ser. No. 25,456, Mar. 30, 1979, Pat. No. 4,349,612, said Ser. No. 238,500, said Ser. No. 230,333, said Ser. No. 191,780, said Ser. No. 172,671, is a continuation-in-part of Ser. No. 89,949, Oct. 31, 1979, abandoned, Ser. No. 98,654, Nov. 29, 1979, Pat. No. 4,290,391, and Ser. No. 73,539, Sep. 7, 1979, Pat. No. 4,260,654, said Ser. No. 238,500, said Ser. No. 230,333, is a continuation-in-part of Ser. No. 25,456, said Ser. No. 191,780, said Ser. No. 172,671, said Ser. No. 89,949, said Ser. No. 98,654, said Ser. No. 73,539, said Ser. No. 25,456, is a continuation-in-part of Ser. No. 963,313, Nov. 24, 1978, abandoned.

[51] Int. Cl.⁴ .............................................. B32B 15/02
[52] U.S. Cl. .................................. 428/652; 428/681; 428/685; 502/301; 502/337
[58] Field of Search ............... 148/31.5; 428/613, 652, 428/653, 682, 685, 681, 550; 502/301, 337, 325, 338

[56] References Cited

U.S. PATENT DOCUMENTS

| | | | |
|---|---|---|---|
| 3,560,404 | 2/1971 | Kelkheim et al. | 502/301 |
| 3,809,658 | 5/1974 | Csuros et al. | 502/301 |
| 4,066,806 | 1/1978 | Speirs et al. | 428/653 |
| 4,179,412 | 12/1979 | Inaba et al. | 502/301 |
| 4,292,208 | 9/1981 | Baldi et al. | 428/685 |
| 4,435,481 | 3/1984 | Baldi | 502/301 |

*Primary Examiner*—L. Dewayne Rutledge
*Assistant Examiner*—S. Kastler
*Attorney, Agent, or Firm*—Connolly & Hutz

[57] ABSTRACT

Workpieces are very rapidly pack diffusion coated by using an excess of energizers in the pack, heating the retort containing the packed workpieces at a rate that brings the workpieces to diffusion-coating temperature and then completing the diffusion coating, all in less than 50 minutes, then cooling the retort. Workpiece can have top coating layer of aluminum flake covered by a layer of extremely fine alumina or silica in a magnesium chromate binder, to provide surface having roughness at least about 10 micro-inches smoother than before the top coating. More active diffusion coated products are also produced.

5 Claims, No Drawings

PYROPHORIC STAINLESS STEEL

This application is a continuation-in-part of applications Ser. No. 479,211 filed Mar. 28, 1983, Ser. No. 417,214 filed Sept. 13, 1982, (subsequently abandoned) Ser. No. 311,621 filed Oct. 14, 1981 (subsequently abandoned), Ser. No. 302,979 filed Sept. 17, 1981 (subsequently abandoned), Ser. No. 191,780 filed Sept. 29, 1980 (subsequently abandoned), Ser. No. 172,671 filed July 28, 1980, (U.S. Pat. No. 4,435,481 granted Mar. 6, 1984); and Ser. No. 851,504 filed Nov. 14, 1977 (subsequently abandoned), the first four of which in turn are continuations-in-part of application Ser. No. 238,500 filed Feb. 26, 1981 (U.S. Pat. No. 4,350,719 granted Sept. 21, 1982) and Ser. No. 230,333 filed Feb. 2, 1981 (U.S. Pat. No. 4,347,267 granted Aug. 31, 1982) and the first six of which are continuations-in-part of Ser. No. 25,456 filed Mar. 30, 1979 (U.S. Pat. No. 4,349,612 granted Sept. 14, 1982); while Ser. Nos. 238, 500, 230,333, 191,780 and 172,671 are continuations-in-part of Ser. No. 89,949 filed Oct. 31, 1979 (subsequently abandoned), Ser. No. 98,654 filed Nov. 29, 1979 (U.S. Pat. No. 4,290,391 granted Sept. 22, 1981), and Ser. No. 73,539 filed Sept. 7, 1979 (U.S. Pat. No. 4,260,654 granted Apr. 7, 1981). Ser. Nos. 238,500 and 230,333 also are continuations-in-part of Ser. No. 25,456. Ser. Nos. 191,780, 172,671, 89,949, 98,654, 73,539 and 25,456 are continuations-in-part of Ser. No. 963,313 filed Nov. 24, 1978 (subsequently abandoned), Ser. No. 953,762 filed Oct. 23, 1979 (U.S. Pat. No. 4,241,147 granted Dec. 23, 1980), Ser. No. 809,189 filed June 23, 1977 (U.S. Pat. No. 4,308,160 granted Dec. 29, 1981) and Ser. No. 752,855 filed Dec. 21, 1976 (U.S. Pat. No. 4,208,453 granted June 17, 1980). Ser. Nos. 851,504 (subsequently abandoned), 963,313 and 953,762 are continuations-in-part of Ser. Nos. 809,189, 752,855, 694,951 filed June 11, 1976 (subsequently abandoned) and 614,834 filed Sept. 19, 1975 (U.S. Pat. No. 4,141,760 granted Feb. 27, 1979); while Ser. No. 614,834 is a continuation-in-part of Ser. No. 446,473 filed Feb. 27, 1974 (U.S. Pat. No. 3,958,046 granted May 18, 1976). Ser. Nos. 302,979, 238,500 and 230,333 are also continuations-in-part of Ser. No. 809,189.

The present invention relates to the diffusion coating of metals and the provision of coatings that have very smooth surfaces.

Additional objects of the present invention include the provision of very rapid diffusion coating processes and the making of pyrophoric stainless steel.

Aluminizing of ferrous metals is widely practiced inasmuch as treatment sharply increases the resistance of these metals to corrosion. Even stainless steels can have their corrosion resistance increased in this manner, and stainless steel gas turbine engines have long had their compressor blades diffusion aluminized to this end. U.S. Pat. Nos. 3,859,061 and 3,597,172 describe such an operation.

The aluminizing operation adds some thickness to the metal workpiece that is aluminized, and to keep the dimensional changes small the aluminizing is effected by diffusion, generally pack diffusion, as described in U.S. Pat. No. 3,859,061. Thus the industry generally calls for an aluminized case only about 0.2 to about 2 mils thick. Such cases increase the overall metal thickness only about 0.15 to about 1.5 mil—that is, about ¾ the thickness of the case itself. They also provide considerable corrosion protection even though their maximum aluminum content, at the outer stratum for instance, is about 50% or below.

Aluminizing by dipping in molten aluminum is not suitable for such purposes because it adds too much thickness as well as too much irregularity, and the outer stratum thus formed is entirely or almost entirely aluminum which does not have the strength or hardness of a ferrous metal. Gas turbine engine airfoils are designed to have the minimum dimensions that provide the desired strength, and some can have an overall thickness of less than 50 mils. Adding 2 mils to each face of such a small thickness takes the airfoil out of tolerance, and manufacturing the airfoil thinner to accomodate such heavy aluminizing weakens the airfoil excessively.

Such small airfoils not only have very close dimensional tolerances, but they are fitted very close to each other so that the gases being compressed by them have a very narrow path to move through. These gases also move at very high speed through the narrow paths, and it is accordingly very important that the airfoil surfaces defining the paths, be quite smooth. In some cases a smoothness of about 25 micro-inches is needed, although as much as 38 micro-inches can generally be tolerated.

Unfortunately the low-temperature diffusion aluminizing of age-hardenable stainless steels widely used in the foregoing airfoils causes their surfaces to become excessively rough. Thus such an airfoil which before aluminizing can have an 18 micro-inch roughness, becomes an aluminized airfoil with a roughness of 40 or more micro-inches. Similar roughening takes place when diffusion aluminizing workpieces containing other age-hardenable stainless steels such as 17-4 PH and those containing about 2 to 5% molybdenum.

It is not practical to try to smooth the surfaces after they have become roughened this way. For one thing any removal of surface metal by polishing reduces the thickness of the aluminized case and thus reduces the protection that the aluminizing was intended for.

Aluminizing at high temperatures, that is about 1200° F., causes less roughening, but is not desired inasmuch as the aluminizing is generally the last treatment of the workpiece at high temperatures, and aluminizing at a temperature above about 950° F. generally leaves the workpiece in need of additional heat treatment to improve its mechanical properties.

Excessive roughening during low-temperature diffusion aluminizing is avoided without significantly detracting from the properties of the aluminized product, by preceding the aluminizing with the deposit on the surface to be aluminized, of a layer of nickel or cobalt or mixtures of the two, not over about 0.1 mil thick. This is shown in the following examples.

EXAMPLE 1

A group of AM 355 last stage compressor blades about 9/16 inch wide, 2 inches long, and about 30 mils in thickness, for a J-85 jet engine, were cleaned by anodic treatment at 50 amperes per square foot in a 160°–180° F. water solution of sodium carbonate (1 oz./gal.) and sodium hydroxide (1 oz./gal.) for one minute, followed by water rinse and then a dip in 18% HCl.

After cleaning these blades showed a surface roughness of 17 to 20 micro-inches. They were given a four minute electroplating treatment by applying a long magnet to the roots of a row of individual blades, immersing the airfoils of the blades so held in a solution of 426 g. of $NiCl_2.6H_2O$ and 70 cc. concentrated HCl in enough water to make one liter, and connecting the magnet as a cathode with respect to a nickel anode also immersed in the same solution. The cathode current density was 50 amperes per square foot, and the bath temperature about 27° C.

The electrolysis was then terminated, the plated blades were rinsed with water, dried and inspected. A bright coating was observed over the entire airfoil surfaces of the blades, and one of them on sectioning showed a nickel plate thickness of about 0.04 to about 0.09 mil. The remaining dried blades were then packed in a plain carbon steel diffusion-coating retort previously used for aluminizing. The packing was with a powder pack having the following composition by weight:

| | | |
|---|---|---|
| Powdered aluminum - about 10 micron particle size | 20 | parts |
| Powdered alumina - minus 325 mesh | 79.7 | parts |
| Aluminum chloride, anhydrous | .3 | parts |

The aluminum and alumina were in the form of a mixture that had been previously used as an aluminizing pack.

The packed retort was then placed in an outer retort as described in U.S. Pat. No. 3,801,357 and under the bathing action of hydrogen was heated to bring the pack to a temperature of 850° to 870° F. as measured by a thermocouple also inserted in the pack. The temperature was then maintained for 25 hours, after which the retorts were permitted to cool and the blades unpacked. As removed from the pack they showed a surface roughness from about 24 to about 30 micro-inches and presented a very good appearance.

One of the thus-treated blades was sectioned and examined microscopically. It showed an average aluminide case about 0.4 mil thick, the outer layer of the case having a high nickel structure that extended into the case about one-fifth the case depth. A salt-spray test showed a little better corrosion resistance for these treated vanes as compared with corresponding blades aluminized without nickel plate. The ductility of the aluminized cases was about the same with the nickel plate as without it, as indicated by deforming such blades.

Additional AM 355 blades of the same type were subjected to the same sequence of treatment steps except that the electrolytic plating time was extended to 12 minutes. These showed that before aluminizing a nickel plate thickness of about 0.2 mil was deposited, and after aluminizing the case was much more brittle than the cases applied over the thinner nickel plating. This 0.2 mil nickel plate thickness is the minimum such thickness suggested in U.S. Pat. No. 3,859,061.

The nickel plating can be applied by vapor deposition, or by ion deposition as described in U.S. Pat. No. 4,039,416 or in the Society of Automotive Engineers, Paper No. 730546, by Gerald W. White, entitled "Applications of Ion Plating" or by sputtering as described in the paper RF Sputtering by the same author and presented at the 8th Annual FAA International Aviation Maintenance Symposium, Oklahoma City, Okla., Nov. 28, 1972. Electroless plating can also be used with somewhat poorer results, inasmuch as the electroless platings contain phosphorus or boron or the like. The minimum suitable nickel plating thickness is about 0.01 mil. Electroplating in narrow passageways is readily accomplished with the help of an anode in wire from penetrating through the passageways.

The aluminizing can be effected with the workpieces embedded in a diffusion-coating pack as shown above, or with the workpieces kept out of contact with, but adjacent to the pack. The lowest practical aluminizing temperature is about 700° F., and other activators can be used in place of the aluminum chloride.

EXAMPLE 2

The processing of Example 1 is repeated with the following changes:

The activator is anhydrous aluminum bromide instead of the aluminum chloride.

The diffusion-bathing atmosphere is argon rather than hydrogen.

The initial cleaning of the blades was by solvent degreasing in place of the anodic electrolytic cleaning.

The aluminizing is conducted at 880°–900° F. to yield a case about 0.7 mil thick.

The surface roughness after aluminizing is about 28 to 35 micro-inches. Other cleaning steps such as simple glass blasting can also be used with similar results.

EXAMPLE 3

The processing of Example 1 is repeated but $CoCl_2.6H_2O$ was substituted for the $NiCl_2.6H_2O$ of Example 1, the quantity being unchanged. The resulting aluminized vanes have a surface roughness about the same as the Example 1 products, and showed even greater resistance to corrosion.

EXAMPLE 4

The processing of Example 1 is repeated but AM 350 airfoils are used, the nickel chloride is replaced by a mixture of 107 g. $NiCl_2.6H_2O$ and 107 g. $CoCl_2.6H_2O$, the HCl content of the electroplating solution is increased 50%, the cathodic electroplating current density is 100 amperes per square foot, the electroplating temperature is 35° C., and the electroplating time 2 minutes. The roughness of the final product is only about 5 to 10 micro-inches more than the untreated airfoils.

The aluminized blades can be used with or without the top coatings described in U.S. Pat. Nos. 3,859,061, 3,958,046, 3,948,687, 3,764,371 and 4,141,760 as well as parent application Ser. No. 417,214. These top coatings after drying and firing generally provide a surface somewhat smoother than that of the surface on which they are applied. Thus a top coating containing leafing aluminum as described in column 6 of U.S. Pat. No. 3,958,046, applied as a 0.3 milligram per square centimeter layer over the aluminized product of Example 1 in the present specification and fired at 700° F., improves the smoothness by about 2 to 5 micro-inches. Such a top coating over a rougher similarly aluminized workpiece which did not have the thin nickel electroplate, brought the top smoothness down to close to 30 micro-inches. Burnishing the coatings by agitating the coated workpieces in a burnishing barrel with steel burnishing discs as disclosed in Ser. No. 417,214 further improves the top smoothness, and the contents of that application are incorporated herein as though fully set out.

Increasing the number of top coating layers on the workpiece further improves the smoothness, but will generally not get the smoothness much below about 24 micro-inches. A series of three layers of the above-noted flake aluminum coating on the product of Example 4 builds up the total top coating weight to 0.8 to 0.9 milligrams per square centimeter and shows a surface roughness as low as about 20 micro-inches.

Some top coating formulations when cured form hydrophobic surfaces over which it is difficult or impossible to apply a uniform overlying layer. The teflon-containing formulations of U.S. Pat. No. 3,948,687 are examples of such difficult materials. However top coatings that contain at least about 5% leafing aluminum by weight, or contain at least about 0.1% by weight wetting agent not destroyed or driven off by a curing operation, will accept overlying coatings fairly well.

One type of coating seems unique in that when applied over a top coating containing flake aluminum, has an exceptional smoothing effect. Thus an aqueous dispersion of colloidal silica containing 14% of the silica, and also containing 15% of a bonding agent such as magnesium chromate or mixtures of magnesium phosphate and magnesium chromate or such mixtures that also contain a little free phosphoric or chromic acid, when applied over other top coatings or other layers of the same top coating, will get the smoothness down to 10 to 15 micro-inches. Such a smoothness does not appear obtainable from other top coating layers regardless of how many are applied.

Thus an improvement of 14 micro-inches is obtained when coating an unaluminized Type 304 stainless steel compressor blade having an original roughness of 42 micro-inches after glass bead blasting to clean it, using the following coating treatment.

EXAMPLE 5

(a) Spray on the blade surface a suspension of the aluminum paste of Example I in U.S. Pat. No. 3,318,716 dispersed in 30 times its weight of a 4% water solution of MgCrO$_4$, the coating residue after drying weighing about 0.25 milligrams per square centimeter.

(b) Dry and then bake the coated blade at 700°–800° F. for 10 minutes.

(c) Repeat steps (a) and (b) on the baked blade.

(d) Repeat steps (a) and (b) again.

(e) Spray on the resulting coated blade a 5% suspension of colloidal alumina in the teflon-free magnesium phosphate-chromate acid solution of Example II in U.S. Pat. No. 3,948,687, the alumina particles having a particle size below 10 millimicrons, to leave a stratum that after drying weighs about 0.6 milligram per square centimeter.

(f) Repeat the drying and baking step (b).

(g) Repeat step (e) on the thus baked blade.

(h) Repeat the drying and baking.

(i) Repeat step (e) again.

(j) Repeat the drying and baking.

The final coated blade shows a roughness of about 28 micro-inches and makes a very effective compressor blade for jet engines.

This exceptional top smoothness is provided by dispersions containing about 1 to 20% of silica or alumina particles no larger than about 25 millimicrons in size and a water-soluble bonding agent in an amount at least equal to that of the dispersed particles. However magnesium chromate is a particularly desirable bonding agent inasmuch as it has strong corrosion-inhibiting effects on a metal workpiece it covers. As much as half the magnesium chromate can be replaced by magnesium phosphate and/or chromic acid and/or phosphoric acid. The hardness and mar-resistance of aluminum flake coatings is also markedly increased by such colloidal over-coatings.

The foregoing smoothness effect of top coatings is provided on other substrates such as on type 410 stainless steel airfoils that have been aluminized without the help of the thin nickel or cobalt flash electroplate, but such electroplates at least 0.01 mil thick make for a much smoother product on age-hardenable stainless steels.

The compositions of AM 355 as well as of other typical age-hardenable steels suitable for the present invention is given below, taken from ASTM Data Series Publication No. DC 9d, October 1967.

| | GROUP I FERRITIC (MARTENSITIC) STEELS | | | | | | | | | | | | | |
|---|---|---|---|---|---|---|---|---|---|---|---|---|---|---|
| | Nominal Chemical Composition, percent | | | | | | | | | | | | | |
| Alloy | C | Mn | Si | Cr | Ni | Co | Mo | W | Cb | Ti | Al | B | Zr | Fe | Other |
| | Age-Hardening Stainless Steels | | | | | | | | | | | | | |
| AM.350 | 0.10 | 1.00 | 0.40 | 16.50 | 4.25 | — | 2.75 | — | — | — | — | — | — | Bal. | — |
| AM.350 | — | — | — | — | — | — | — | — | — | — | — | — | — | — | — |
| AM.355 | 0.15 | 1.00 | 0.40 | 13.50 | 4.25 | — | 2.75 | — | — | — | — | — | — | Bal. | 0.10 N |
| AM.355 | — | — | — | — | — | — | — | — | — | — | — | — | — | — | — |
| AM.363 | 0.04 | 0.15 | 0.05 | 11.00 | 4.00 | — | — | — | — | 0.25 | — | — | — | Bal. | — |
| 16.5PH | 0.04 | 0.30 | 0.40 | 15.00 | 4.60 | — | — | — | 0.25 | — | — | — | — | Bal. | 3.30 Cu |
| 17.4PH | 0.04 | 0.30 | 0.60 | 16.00 | 4.25 | — | — | — | 0.25 | — | — | — | — | Bal. | 3.30 Cu |
| 17.7PH | 0.01 | 0.50 | 0.30 | 17.00 | 7.10 | — | — | — | — | — | 1.10 | — | — | Bal. | — |
| 17.7PH | — | — | — | — | — | — | — | — | — | — | — | — | — | — | — |
| PH13-8 Me | 0.04 | 0.05 | 0.05 | 12.75 | 8.10 | — | 2.2 | — | — | — | 1.10 | — | — | Bal. | — |
| PH14.8 Mo | 0.04 | 0.30 | 0.40 | 14.35 | 8.15 | — | 2.2 | — | — | — | 1.10 | — | — | Bal. | — |
| PH15.7 Mo | 0.07 | 0.50 | 0.30 | 15.10 | 7.10 | — | 2.2 | — | — | — | 1.10 | — | — | Bal. | — |
| Pyromet X-15 | 0.03 | 0.10 | 0.10 | 15.00 | — | 20 | 3.0 | — | — | — | — | — | — | Bal. | — |
| AFC-77 | 0.15 | — | — | 14.50 | — | 13 | 5.0 | — | — | — | — | — | — | Bal. | 0.40 V |
| Stainless W | 0.12 | — | — | 17.00 | 7.00 | — | — | — | — | 1.0[a] | 1.0[b] | — | — | Bal. | 0.2 N |
| Illium P | 0.20 | 0.75 | 0.75 | 23.00 | 8.00 | — | 2.25 | — | — | — | — | — | — | 56.8 | 3.25 Ca |
| Illium PD | 0.10 | 0.75 | 0.75 | 26.00 | 3.00 | 6.5 | 2.25 | — | — | — | — | — | — | 54.0 | — |

[a]For rupture in 100 and 1000 br. Not for design purposes.
[b]Cast alloy.
[c]Maximum
[d]Experimental alloy.
[e]Alloy known not to be in commercial production.

When a stainless steel workpiece is to be aluminized, a very effective pre-cleaning is accomplished by the following sequence, or by grit blasting with 220 mesh alumina grit.

EXAMPLE 6

First subject the workpiece to ¼ minute cathodic treatment at about 50 amperes per square foot in a 10% solution of sodium carbonate in water, then anodically treat it in the same solution at about the same current density for about the same time, after which the workpiece is rinsed with water, dipped in 10% NaOH solution in water to remove any residual smut, then in cold 1:1 concentrated HCl diluted with water, followed by another water rinse.

The resulting cleaned workpiece with a surface roughness of about 18 micro-inches is ready for plating in an acid nickel salt bath to a pick-up of about ½ milligram per square centimeter producing a nickel flash about 0.07 mil thick. After rinsing and drying it can then be aluminized in the powder pack of Example 4 for 30 hours at 870° to 890° F. to yield an aluminized case about 0.7 mil thick and having a surface roughness of about 22 to 23 micro-inches.

The aluminizing step in the above examples can be effected in very short times by heating a workpiece embedded in an activated powder pack, with a thermal input that brings it to diffusion coating temperature and completes the diffusion coating all in about 50 minutes or less. During this short interval the activator present in the pack begins to be volatilized at a relatively rapid rate that persists about 45 minutes, even if only present in the pack at a concentration of 0.5% by weight, and the formation of the diffusion coating case is extremely rapid. Thus a 2 mil aluminized case is produced only about 30 minutes after startiong to heat a workpiece to 1800° F. in a pack of

| 10 parts by weight | Aluminum powder about 100 microns in size |
| --- | --- |
| 45 parts by weight | Chromium powder about 10 microns in size |
| 50 parts by weight | Al$_2$O$_3$ about 100 microns in size | with 0.5% NH$_4$Cl mixed in based on the weight of the pack, if the workpiece reaches 1800° F. in 15 minutes.

It is preferred to have the workpiece covered by no more than about ½ inch of activated pack when it is heated, inasmuch as the pack acts as thermal insulation and slows down the penetration of the heat to the workpiece from the walls of the retort in which it is held during the heating. With the workpiece embedded in a pack held in a cylindrical retort having a 7 inch length and a 2 inch diameter, so that about ½ inch pack thickness envelopes the workpiece, heat supplied at the rate of at least about 200,000 BTU per hour per pound of workpiece will effect the desired heat-up to temperatures as high as 1800° F. During such heat-up the retort can have one or both its ends loosely covered to permit escape of gases, and can be held in a larger retort through which hydrogen or argon is flowed at a slow rate to flush out the escaping gases.

It is not necessary to arrange the workpiece so that it comes to within ¼ inch of the retort as described in U.S. Pat. No. 3,824,122. Indeed the presence of a ½ inch thick pack covering is preferred when practicing the rapid diffusion coating of the present invention insasmuch as it assures the presence of sufficient energizer even when the energizer content of the pack is only 0.5% or less by weight. The energizer content can be increased, for example to 1%, or 2%, and energizer can be additionally or alternatively added to the metal powder deposited on the wall of a narrow passageway to be diffusion coated.

A retort packed in accordance with the rapid diffusion coating technique of example 6 can contain a number of workpieces and there is no need to position each workpiece into its own carefully dimensioned closely fitting retort as in U.S. Pat. No. 3,824,122.

Diffusion coating at temperatures no higher than about 1000° F., as in the aluminizing of Example 1, is even more readily accomplished in short periods of time—not over 45 minutes of heating is generally needed to bring the workpieces to temperature and obtain an aluminized case at least 1 mil thick. Thinner cases require only about 30 minutes or even less. Zinc and aluminum can both be very effectively and very rapidly diffusion coated into other metals at the foregoing low temperatures.

To further save time the retort cooling is best effected by withdrawing it from the furnace in which the heating is carried out. Exposed to the ambient air and with the help of the flushing gas stream between the retorts, the cylindrical retort assembly described above cools in about 15 minutes to the point that the outer retort can be opened and the inner retort withdrawn, exposed to the atmosphere and emptied. In this way the entire diffusion coating sequence including the completion of the cool-down takes only about an hour or 65 minutes. This compares with the 1½ hours disclosed in U.S. Pat. No. 3,824,122 for just the heating time. The cool-down can also be accelerated by blowing air over the cooling retort assembly or by lowering it into a quenching liquid such as water.

U.S. Pat. No. 3,117,846 suggests a powder pack diffusion heating for one-half hour, but that time does not include the time needed to bring the powder pack and the workpiece to the diffusion coating temperature. Such heat-up time is generally a number of hours if the continuous treatment technique of U.S. Pat. No. 3,824,122 is not used.

Pack chromizing is generally not conducted at temperatures below about 1100° F., so that it cannot be completed as rapidly as the most rapid pack aluminizings. However a 300° or 400° F. increase in diffusing temperature only takes about 5 minutes longer to attain by the foregoing heat-up technique.

The diffusion coating packs can be prepared by mixing together the individual pure ingredients, or from other sources such as scrap materials that contain one or more of the desired ingredients. Thus chromium hydroxide sludges precipitated from used chromium plating or anodizing or leather tanning baths, are difficult to dispose of without creating environmental problems. A similar problem is faced by sludges from used nickel, cobalt and copper plating solutions, and from iron-loaded pickling rinses. Such sludges are however readily converted to pack diffusion ingredients as by drying and then reacting them with metallic magnesium, as described in U.S. Pat. No. 3,801,357, French Pat. No. 1,123,326 and French Addition Pat. No. 70,936. Such treatment converts chromium hydroxide to metallic chromium, while the magnesium is converted to magnesium oxide which acts as inert refractory diluent for the metallic chromium when the mixture is used as a diffusion chromizing pack.

The presence of aluminum hydroxide and other insoluble heavy metal compounds in the sludge need not interfere with the use of the magnesium-reacted product as a diffusion coating pack. A relatively large content of iron can for example be tolerated where the articles to be diffusion chromized have a substantial iron content. Most metals to be diffusion-coated are alloys containing many ingredients, and the presence of the corresponding ingredients in the diffusion coating packs in small amounts does not create problems. It is generally preferred that the contaminating metals be present in the sludge at a concentration less than 20% based on the total weight of the metal in the sludge. For this computation, only the metal portion of the compounds in the sludge are considered.

To minimize expense the content of metallic magnesium after the magnesium treatment is best kept quite low, as by using a stoichiometric or less than stoichiometric proportion of magnesium for that treatment, or by vacuum evaporating any residual magnesium metal to recover it. Insufficient magnesium will leave a little unreacted oxide of the sludge metal in the reduced mixture, but this metal oxide does no harm where the same metal is being diffusion coated. Indeed a little dried but otherwise untreated sludge can be added to a used diffusion coating pack to make up for the metal that has diffused out. During the course of the next diffusion coating run with that replenished pack, some or all of the added metal hydroxide is converted to metal by the halide-containing hydrogen generally used as the diffusion coating atmosphere.

Excess magnesium in the sludge-reduction can also be tolerated. Some excess will evaporate off during the sludge-reducing heat but 1 to 2% residual magnesium in a chromizing pack is helpful and improves the chromized product.

The reducing action of the magnesium is effected by magnesium vapor, and the reducing step is generally conducted at a temperature of from about 1400° to about 2000° F. in an inert or reducing atmosphere. The mixture resulting from the reducing reaction ordinarily has its components so tightly held to each other mechanically that they are difficult or impossible to separate by mechanical treatment. According to the present invention, however, no such separation is needed.

The following is an illustrative example.

EXAMPLE 7

A chromium hydroxide sludge containing about 4% iron and 5% aluminum, based on the weight of its total metal content, has its pH adjusted to between 8 and 9 with ammonia or acetic acid, and is then dried at 250° F. The resulting cake is ground and 900 grams of the ground product is poured over a solidified 500 gram mass of magnesium in a steel pipe retort which is then loosely covered and placed in an outer retort having inlet and outlet lines for supplying it with a controlled atmosphere.

The retorts are then heated to 1600° F. and kept within ±50° F. from that temperature for 10 hours, while a stream of argon is flushed through the outer retorts. At the end of that time period the retorts are cooled to room temperature, the argon flow then stopped, and the reacted product removed. It is a very fine mixture of magnesium oxide powder and reduced metal.

That mixture is then used as a pack chromizing powder to chromize a 1010 steel rod. About ½% by weight $NH_4Cl$ is first added to and distributed through the mixture, and the resulting material used to pack the steel rod in a diffusion coating retort. The diffusion heat is conducted as described in U.S. Pat. No. 3,801,357, at 1900° F. for 12 hours. After cool-down, the chromized rod shows a high quality chromized surface. The small amount of aluminum originally in the sludge is apparently not effective to detract from the quality of the diffusion coating, and neither is its iron content.

Instead of using the magnesium-reduced sludge for a pack that causes its metal content to diffuse into a workpiece, it can be used as a masking mixture that prevents such diffusion coating. This is demonstrated in the following example.

EXAMPLE 8

A concentrated sludge from the precipitation with soda ash of the nickel salts in a used nickel plating rinse bath, is neutralized, dried, and reacted with half its weight of magnesium as in Example 7 to produce a nickel-bearing powder. This powder is then slurried in a solution of ethyl methacrylate in methyl chloroform as described for the top masking layer in Example 1 of U.S. Pat. No. 4,208,453, and the slurry used in the aluminizing process of that Example 1. A very good masking is obtained.

Metallic aluminum is not as volatile as, and does not behave like magnesium to effect the sludge reduction. Molten aluminum does reduce chromium oxide with which it comes into contact but the reduced metal tends to dissolve in or alloy with the molten aluminum and thus dilute the reducing action, eventually bringing it to a halt. A similar difficulty is also experienced with nickel oxide reduction, but not with iron oxide reduction.

Sludges of low-melting metals like aluminum, zinc and cadmium can be reduced with magnesium to also produce products useful for diffusion. Some oxides like zinc and aluminum oxides are more difficult for magnesium to reduce, and when present in chromium sludge, for example, will generally not be completely reduced, particularly if no excess of magnesium is used. This feature can be utilized to decrease the content of such difficulty reduced metals in a sludge containing more readily reduced materials that are of primary interest.

The foregoing very rapid diffusion coating technique is particularly suited for preparing pyrophoric articles such as the foils described in U.S. Pat. No. 4,292,208. A mass of such articles can be mixed up with the diffusion coating powder and very quickly aluminized as a batch. The aluminized articles can then be sifted away from the powder and leached to remove enough aluminum to make them pyrophoric.

Conducting the leaching at relatively low temepratures, below 110° F., has been found to yield more vigorous pyrophoricity. Thus a cold leaching bath of 10 to 20% by weight NaOH in water can be cooled with a cold water jacket and by agitation during leaching of aluminized iron foils originally 1 mil thick, can have its temperature rise limited so that it gets no hotter than 100° F. About two hours or more of such low-temperature leaching yields highly pyrophoric iron foils that no exposure to air heat up to at least about 1300° F. In addition pyrophoric iron and nickel foils so leached have much longer storage lives when kept under water such as tap water, than corresponding pyrophoric foils produced by leaching at 180° F.

Another feature of the low-temperature leaching is that it can be used to make stainless steels pyrophoric. As pointed out in U.S. Pat. No. 4,292,208, it has previously been considered impossible to make pyrophoric iron alloys that contain over about 5% chromium. By carefully holding the leaching temperature down to 90° F. throughout the leaching, a stainless steel foil such as type 430 originally 1 mil thick, diffusion aluminized on both faces with low-temperature aluminized cases that leave only about 0.3 mil of the original foil thickness untreated, can be made sufficiently pyrophoric to char paper with which it is in contact when it is exposed to air. The temperature needed to char that paper is about 350° F. and the degree of charring indicates that the stainless steel foil pyrophorically heats itself up to at least about 380° F.

The caustic concentration in the leaching solution can vary from a saturated solution of KOH to a solution having as little as 5% NaOH. The more concentrated solutions leach more vigorously and thus tend to heat themselves up more rapidly, so that more careful cooling is needed unless the volume of leaching solution is so large compared to the metal surface being leached, that the solution cannot be overheated by the exothermic leaching reaction.

It generally takes at least about a 0.4 mil thick aluminized case on a surface of a stainless steel object to produce after leaching a readily observed pyrophoric warming when the object itself is not over about 10 mils thick. For such a small case depth, sufficient leaching out of aluminum is completed after about 30 minutes at 90° F., or about 1 hour at 50° F.

For the most vigorous pyrophoricity, an aluminized case depth of about 2 mils thick should be provided on an object in which such case represents about 80% of the total thickness of the aluminized object. As noted above the forming of an aluminized case increases the overall thickness of the original object by about three-fourths the case depth. For the above-noted thick case, the leaching generally takes about 3 hours at 90° F. or about six hours at 50° F. to bring out the maximum pyrophoricity. To get hot enough to scorch paper, it is preferred to provide a case depth at least one-sixth the total thickness of the body of a stainless steel article, where the activated case is only on one face, or at least one-twelfth that thickness where both faces are activated.

The foregoing pyrophoric activity is imparted by the same process to other iron-chromium and iron-chromium-nickel alloys containing over 5% and as much as 30% chromium. The crystallographis structure of these alloys can be of any type, including austenitic, martensitic and ferritic. Specific stainless steel alloys suitable for such treatment include high-carbon stainless steels, 18-8 (type 304) and 25-12 stainless steels, as well as iron containing 12% chromium and the type 430 stainless steel aready noted. Although some of these stainless steels are not true steels inasmuch as they contain little or no carbon, they all come within the stainless steel category of the present invention.

The diffusion aluminizing conducted to provide pyrophoric stainless steets is most effective when carried out at temperatures no greater than about 1000° F. As the diffusion temperatures increase above that value, the aluminum diffusing into the stainless steel penetrates more and more rapidly forming cases containing less and less aluminum, and the aluminum is more difficult to leach out as its initial concentration in the case diminishes.

The pyrophoric stainless steels are strongly catalytic as well as pyrophoric, and remain strongly catalytic when the pyrophoricity is lost as by reacting with air or by dipping in 3 volume % $H_2O_2$ in water. Thus the pyrophoric stainless steels are particularly effective catalysts for reducing NOX emissions from furnace stacks and the like with the help of $NH_3$ or reducing gases, as described in Ser. No. 302,979. For such use these pyrophoric catalysts can be merely permitted to react with air before, during or after they are installed in the stack. However, they can alternatively have their pyrophoricity eliminated by $H_2O_2$, if desired.

For NOX reduction the stainless steels can before activation contain helpful alloying metals such as vanadium, manganese, and other metals referred to in Ser. No. 302,979. These alloying metals can be present in the original stainless steel, or they can be plated or diffused into the surface to be activated, or they can be alloyed with the aluminum that is to be diffused in as the first step in the activation. The content of any of these alloying metals is preferably at least about 5 weight percent of the activated case.

The presence of about 10% manganese in the surface of those stainless steel catalysts improves their effectiveness, particularly in stack gases containing high sulfur dioxide content, but the improvement is gradually lost over a span of about a day. A typical diffusion coating with manganese is conducted at 1725° F. for five hours with a diffusion coating pack of 53 g. manganese powder
212 g. $Al_2O_3$ powder
3 g. $NH_4Cl$ powder It can also be used to diffuse manganese into nickel as well as nickel alloys-other than stainless steels. On nickel it gives a weight gain of about 21.9 milligrams per square centimeter, and a case depth of about 1.4 mils.

The manganese-carrying nickel and other nickel alloys have improved catalytic action, for example in the oxidation of formaldehyde to formic acid, as well as in the methanation of CO. Nickel-cobalt-molybdenum alloys heretofore used in such methanation are particularly improved.

A manganese content over about 20 weight percent in the outer skin of any of the foregoing catalysts does not seem to be worth the trouble.

By activating only one face of a foil, as described for example in Ser. No. 172,671, the activation can be made to penetrate most of the way through the foil thickness, leaving only about 20% of that thickness as a structural backbone. The unactivated face of the foil can be plated with aluminum to improve its radar reflection characteristics. The so-called Schoop aluminizing with a spray of molten aluminum is effective to deposit an aluminum film only about 0.1 to 0.3 mils thick on the back of a roll of activated foil as it is unspooled and then respooled in an Argon box. A layer of copper or even silver can be similarly deposited in place of the layer of aluminum. Copper and silver are not attacked by leaching baths, so that they can be deposited before or after the leaching.

The radar reflectively associated with pyrophoric foils is also increased by mixing them with standard aluminum radar chaff or foils. Such aluminum foils only about ½ mil thick or thinner, mixed with two to five times as many pyrophoric 1" discs of iron foil, make an effective heat and radar decoy when ejected as a mass from an exploding cartridge.

The aluminizing and leachng sequences can be used to provide a porous metal surface that better receives coatings, regardless of pyrophoricity. Thus a jet engine hot section turbine blade made of B-1900 superalloy, can be heavily aluminized at about 1100° F. to form an aluminized case 2 to 4 mils thick, after which the treated blade is subjected to boiling 30% NaOH in a water for 12 hours to leach out most if not all of the aluminum from the case. The blade surface is now very porous, and can be kept under water to prevent pyrophoric reaction with air.

The porous-surfaced blade is now dipped into an aqueous 1% solution of platinum chloride, and absorbs a substantial quantity of the platinum chloride in its pores. The resulting blade dried in an inert atmosphere or still wet, is now inserted in a diffusion aluminizing retort and subjected to chromaluminizing at about 1800° F. for about 6 hours, as described in U.S. Pat. No. 3,801,357, or to corresponding simple aluminizing as described in U.S. Pat. No. 4,347,267. The final blade has a surface the outer 2 to 4 mils of which contain platinum and aluminum in quantities that provide considerable resistance against high temperature attack by engine combustion products. Because the last diffusion coating is effected at a temperature which decomposes the platinum chloride into its elements, the platinum in the final blade is in metallic form, and is quite uniformly distributed, probably as a platinum aluminide.

Other metals such as rhodium and other platinum family metals can be similarly impregnated relatively deeply into a workpiece. The coating of other nickel-base superalloys as well as of cobalt-base superalloys can be improved by the foregoing preliminary porosity-treatment sequence, and diffusion coatings of chromium or other metals can be substituted for or added to the final aluminizing or chromaluminizing.

Metals like yttrium, hafnium and lanthanum that have protective oxides can be correspondingly impregnated in the form of a decomposable soluble salt like the sulfate or nitrate, and a workpiece thus impregnated heated to decompose the salt to oxide, and then diffusion aluminized or chromaluminized or chromized.

Very finely divided protective metals such as the MCrAlY, MCrAlHf and MCrAlZr alloys known in the art, but having particle sizes of about one micron or less can also be absorbed into the foregoing porous workpiece surfaces from dispersions in a liquid such as water, and then sintered in place by heat treatment that preferably effects at least a little diffusion into the surrounding metal. A final aluminizing or chromaluminizing or chromizing, which can be combined with the sintering step, acts to fill in the residual porosity remaining after the impregnating step.

The foregoing porosity is more effective than the porosity obtained by the partial surface depletion described in U.S. Pat. No. 4,041,196.

Obviously many modifications and variations of the present invention are possible in the light of the above teachings. It is therefore to be understood that within the scope of the appended claims the invention may be practiced otherwise than as specifically described.

I claim:

1. In the process of preparing catalytically activated stainless steel by diffusing aluminum into its surface to form an aluminized case and then leaching out such aluminum with aqueous caustic, the improvement according to which the diffusion is effected at a temperature no greater than about 1100° F., and the leaching is effected at temperatures sufficiently low to render the activated stainless steel pyrophoric.

2. The combination of claim 1 in which the stainless steel is a member having opposite faces both of which are activated with a leached aluminized case at least one-twelfth the thickness between said faces.

3. The combination of claim 1 in which the catalytically-activated pyrophoric stainless steel is treated to eliminate its pyrophoricity without eliminating its catalytic activity.

4. The combination of claim 5 in which the stainless steel is type 430.

5. Stainless steel having a pyrophoric activity sufficiently strong to scorch paper in contact with it when it is exposed to air.

* * * * *